(12) United States Patent
Elwan et al.

(10) Patent No.: US 7,525,465 B1
(45) Date of Patent: Apr. 28, 2009

(54) RECONFIGURABLE AND ADAPTIVE CONTINUOUS TIME-SIGMA DELTA DATA CONVERTER

(75) Inventors: Hassan Elwan, Mission Viejo, CA (US); Dejun Wang, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 0 days.

(21) Appl. No.: 12/033,305

(22) Filed: Feb. 19, 2008

(51) Int. Cl.
*H03M 3/00* (2006.01)
(52) U.S. Cl. .................... 341/143; 341/155; 341/120
(58) Field of Classification Search ............. 341/143, 341/144, 155, 120
See application file for complete search history.

(56) References Cited

U.S. PATENT DOCUMENTS

| | | | | |
|---|---|---|---|---|
| 5,012,244 A | * | 4/1991 | Wellard et al. .............. 341/143 |
| 5,430,766 A | * | 7/1995 | Ota et al. .................... 375/318 |
| 5,742,246 A | * | 4/1998 | Kuo et al. ................... 341/143 |
| 6,879,459 B2 | * | 4/2005 | Kitazaki et al. ............... 360/75 |
| 6,992,606 B2 | * | 1/2006 | Zogakis et al. .............. 341/131 |
| 7,042,377 B2 | * | 5/2006 | Oliaei ........................ 341/143 |
| 7,436,336 B2 | * | 10/2008 | Vadipour .................... 341/143 |

* cited by examiner

*Primary Examiner*—Peguy JeanPierre
(74) *Attorney, Agent, or Firm*—Rahman LLC

(57) ABSTRACT

A continuous time-sigma delta (CT-SD) data converter comprising a loop filter includes a first integrator having a first loop filter coefficient and a second integrator operatively coupled to the first integrator, the second integrator having a second loop filter coefficient, a modulator coupled to the loop filter, a reset switch coupled to the second integrator, a first peak detector operatively coupled in series with the second integrator to indicate an instability condition of a signal level exceeding a first threshold at an output of the second integrator, a second peak detector adapted to detect an input signal level to the CT-SD data converter, and a digital engine coupled to the first peak detector.

18 Claims, 6 Drawing Sheets

RECONFIGURABLE AND ADAPTIVE CONTINUOUS TIME-SIGMA DELTA DATA CONVERTER

BACKGROUND

1. Technical Field

The embodiments herein generally relate to electrical circuits for Sigma Delta data conversion, and, more particularly, to continuous time-sigma delta (CT-SD) converters.

2. Description of the Related Art

Continuous time-sigma delta (CT-SD) converters are exceedingly used in industries, wherever high-resolution conversion is needed at low power consumption. In multi-channel applications these benefits are multiplied and can enable designers to adopt new and beneficial system architectures that were not previously possible. Potential applications for the technology are widespread in all sectors of the electronics industry, particularly where analog signals need to be converted to digital signals in a power-efficient manner, such as in wireless, television (TV) tuners, cell phones, and satellite tuners.

Two parameters that affect the performance of CT-SD converters are stability and dynamic range. Stability refers to the ability of a system to continue converting signals from analog form to digital form for various signal amplitude frequencies and temperature drifts. Instability of a SD converter results in oscillations and a complete loss of the signal. The instability can be caused by large amplitudes of input signals with specific frequency patterns; temperature drifts that result in a variation in the SD loop filter or because of the non-linear nature of the SD loop itself. Dynamic range refers to the ratio of a maximum level of a parameter such as voltage or frequency, to the minimum detectable value of the parameter. CT-SD data converters typically offer clear advantages in terms of power and dynamic range, however conventional CT-SD data converters are conditionally stable as a function of input signal level and frequency contents.

One approach towards addressing the instability is to back off the signal level to the modulator significantly. This represents a margin that reduces the effective dynamic range of the sigma delta. Hence, there is a trade-off, more margin results in loss of dynamic range and a more stable SD. While reducing the margin for the maximum allowable input signal level improves the dynamic range on the expense of stability. In some cases, a stability detector may reset loop filter integrators when instability is detected. Even temperature variations can cause the loop filter response of the CT-SD converter to change leading to such instability even for small input signals. In such cases, the approach of resetting the converter does not address the cause of the instability. The stability detector is typically based on static criteria, such as an assumption of a constant large signal level at the input.

This assumption is inaccurate especially for applications that require signals with a large peak to average, and leads to a significant trade-off on dynamic range, if the circuit is designed to maximize stability. Also, in certain applications (e.g., orthogonal frequency division multiplexing (OFDM), which is used in many wireless applications) there might be a large difference between the signal level peak and the average signal value (e.g., 14 dB), but this large difference may occur only rarely and for small time intervals. The CT-SD converter can handle signals with larger peaks if they statistically occur every once in a while, but because of the margin and due to the circuit being designed for the highest possible signal level, there is a loss of dynamic range.

In certain cases, the circuit may follow a repetitive pattern of instability. In such cases, if the circuit is designed to maximize dynamic range, it does not meet the requirement of stability, and moreover cannot be easily modified to improve stability. Thus, conventional CT-SD converter designs do not typically provide an optimal dynamic tradeoff between stability and dynamic range in different conditions. Accordingly, there remains a need for a CT-SD converter that is reconfigurable adaptively to optimize stability and dynamic range.

SUMMARY

In view of the foregoing, an embodiment herein provides a CT-SD data converter comprising a loop filter comprising a first integrator having a first loop filter coefficient and a second integrator operatively coupled to the first integrator, the second integrator having a second loop filter coefficient, a modulator coupled to the loop filter, a reset switch coupled to the second integrator, a first peak detector operatively coupled in series with the second integrator to indicate an instability condition of a signal level exceeding a first threshold at an output of the second integrator, a second peak detector adapted to detect an input signal level to the CT-SD data converter, and a digital engine coupled to the first peak detector. The digital engine is configured to execute an optimal processing sequence based on at least one of a pattern of differences between the signal level indicated by the first peak detector and the first threshold and the input signal level detected by the second peak detector.

The reset switch is adapted to issue a reset to the second integrator to reduce the CT-SD data converter to a first order system. The digital engine is configured to relax the loop filter to reduce a dynamic range of the modulator. The CT-SD converter further includes a calibration circuit adapted to calibrate the loop filter frequency response. The digital engine comprises at least one counter. The counter is adapted to indicate at least one of a number of times an unstable condition has occurred, and a number of times the signal level exceeds the first threshold. A digital signal processor unit is adapted to perform calculations on a digitized output signal received from the modulator.

In another aspect, the embodiments provide a program storage device readable by computer, tangibly embodying a program of instructions executable by the computer to perform a method of reconfiguring a CT-SD data converter, the CT-SD data converter comprising a loop filter comprising a first integrator having a first loop filter coefficient and a second integrator operatively coupled to the first integrator, the second integrator having a second loop filter coefficient, a modulator coupled to the loop filter, a reset switch coupled to the second integrator, a first peak detector operatively coupled in series with the second integrator to indicate an instability condition of a signal level exceeding a first threshold at an output of the second integrator, and a second peak detector adapted to detect an input signal level to the CT-SD data converter.

The method comprises determining a number of times the output signal of the second integrator is greater than the first threshold to indicate a number of times an unstable condition has occurred. The first threshold is based on a statistical pattern of the output signal of the second integrator. The loop filter is recalibrated if the number of times the unstable condition has occurred exceeds a second threshold. At least one of an order and a coefficient of the loop filter are switched if the first peak detector indicates an unstable condition upon recalibrating the loop filter. A reset may be issued to all integrators in the loop filter except the first integrator if a signal-to-noise ratio (SNR) at an output of the CT-SD data converter is less than a third threshold to reduce the loop filter to a first order configuration. A gain level of the first integrator may be tuned to lower a gain level of the loop filter.

The signal level of the second integrator of the CT-SD data converter may be detected at an input of the first peak detector. The gain level of the first integrator of the CT-SD data converter may be lowered if the signal level of the second integrator is greater than the first threshold. The modulator may be switched based on a signal-to-noise ratio (SNR) at an output of the CT-SD data converter. Lowering the gain level is achieved by at least one of programming the first integrator to the gain level, and tuning the gain of amplifiers preceding the CT-SD data converter.

In another aspect, the embodiments provide a method of reconfiguring a CT-SD data converter that includes a loop filter comprising a first integrator having a first loop filter coefficient and a second integrator operatively coupled to the first integrator, the second integrator having a second loop filter coefficient, a modulator coupled to the loop filter, a reset switch coupled to the second integrator, a first peak detector operatively coupled in series with the second integrator to indicate an instability condition of a signal level exceeding a first threshold at an output of the second integrator, and a second peak detector adapted to detect an input signal level to the CT-SD data converter. The method further comprises determining a number of times the output signal of the second integrator is greater than the first threshold to indicate a number of times an unstable condition has occurred; recalibrating the loop filter if the number of times the unstable condition has occurred exceeds a second threshold; and switching at least one of an order or a coefficient of the loop filter if the first peak detector indicates an unstable condition upon recalibrating the loop filter.

The first threshold is based on a statistical pattern of the output signal of the second integrator. The loop filter is recalibrated if the number of times the unstable condition has occurred exceeds a second threshold. At least one of an order or a coefficient of the loop filter is switched if the first peak detector indicates an unstable condition upon recalibrating the loop filter. A reset may be issued to all integrators in the loop filter except the first integrator if a SNR at an output of the CT-SD data converter is less than a third threshold to reduce the loop filter to a first order configuration.

A gain level of the first integrator may be tuned to lower a gain level of the loop filter. The signal level of the second integrator of the CT-SD data converter may be detected at an input of the first peak detector. The gain level of the first integrator of the CT-SD data converter may be lowered if the signal level of the second integrator is greater than the first threshold. The modulator may be switched based on a SNR at an output of the CT-SD data converter. Lowering the gain level is achieved by at least one of programming the first integrator to the gain level, and tuning the gain of amplifiers preceding the CT-SD data converter.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
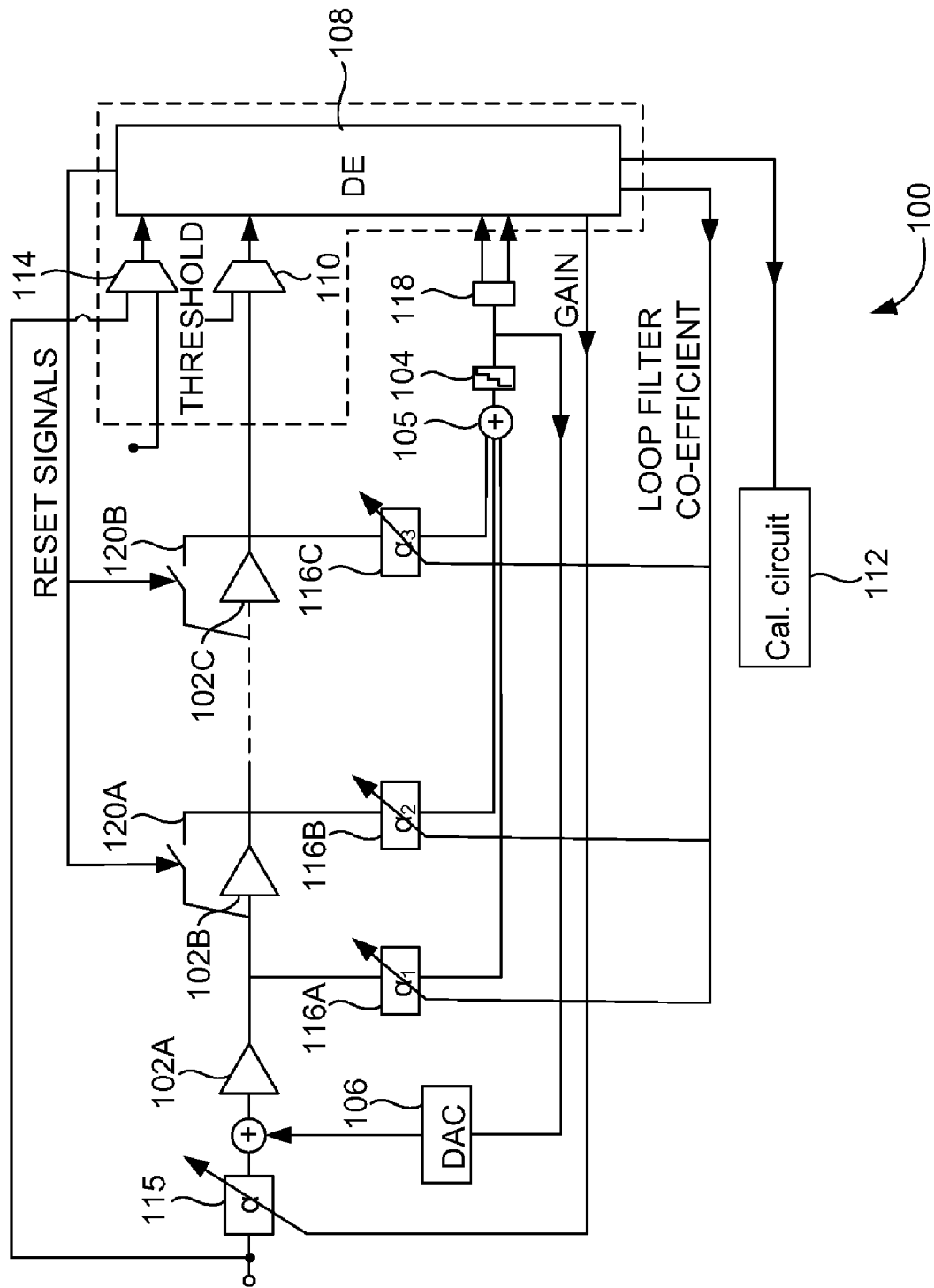
FIG. 1 illustrates a CT-SD loop filter circuit according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a CT-SD data converter comprising a loop filter 100 comprising a first integrator 102A having a first loop filter coefficient 116A and a second integrator 102B operatively coupled to the first integrator 102A, the second integrator 102B having a second loop filter coefficient 116B, a modulator 104 coupled to the loop filter, a reset switch 120A coupled to the second integrator 102B, a first peak detector 110 operatively coupled in series with the second integrator 102B to indicate an instability condition of a signal level exceeding a first threshold at an output of the second integrator, a second peak detector 114 adapted to detect an input signal level to the CT-SD data converter, and a digital engine (DE) 108 coupled to the first peak detector 110. The digital engine 108 is configured to execute an optimal processing sequence based on at least one of a pattern of differences between the signal level indicated by the first peak detector 110 and the first threshold and the input signal level detected by the second peak detector 114. Referring now to the drawings, and more particularly to FIGS. 1 through 6, where similar reference characters denote corresponding features consistently throughout the figures, there are shown preferred embodiments.

FIG. 1 illustrates a CT-SD loop filter circuit 100 having a plurality of integrators 102A-C, a modulator 104, a digital-to-analog converter (DAC) 106, a digital engine 108, a first peak detector 110, a calibration circuit 112, a second peak detector 114, a gain control block 115, loop filter coefficients $\alpha_1, \alpha_2$, and $\alpha_3$ 116A-C, a digital signal processing (DSP) unit 118, and reset switches 120A-B. The loop filter circuit 100 includes a first integrator 102A having the first loop filter coefficient $\alpha_1$ 116A and a second integrator 102C having the second loop filter coefficient $\alpha_2$ 116B. The integrators 102A-C are operatively connected in series with each other. The integrators 102A-C perform the integration of signals received as an input from the DAC 106 or the signal received from the second peak detector 114.

The modulator 104 receives output signals from the integrators 102A-C through the loop filter coefficient $\alpha_1$, $\alpha_2$, and $\alpha_3$ 116A-C. The DAC is operatively connected to the output of the quantizer element 104. The peak detector 110 is operatively connected to the output of one of the integrators (the last one 102B in this case). The DAC 106 converts the output signal received from the quantizer 104 to an analog form, which is fed as an input to the integrator 102A. The digital engine 108 is operatively connected to the first peak detector 110, the other peak detector 114, and executes an optimal sequence based on at least one of a pattern of differences between the signal level indicated by the first peak detector 110 and the first threshold and/or a signal level detected by the second peak detector 114. The digital engine 108 includes counters (not shown). The digital engine 108 stores the outputs of the first peak detector 110 and the second peak detector 114 in a counter for processing. The counter indicates how often the input signal crosses a certain threshold limit for a specific time period (which is programmable and set by a designer) and how many times the CT-SD loop filter circuit 100 was unstable during a predetermined period of time Instability may lead to oscillations by which the outputs of the loop filter integrator 102A-C would rail (exceed a certain threshold that is acceptable), wherein the peak detector 110 may detect this. If railing happens and continues for a time "Tstab" then the peak detector output may provide a logical signal that indicates that. This logical signal may then trigger the digital section 108 to follow the methodology to bring the sigma delta back to stability.

In a preferred embodiment, if the signal level crosses the threshold limit, then a logic high level may be provided by the digital engine 108. This data/information may represent a statistical nature of the input signal peaks as well as the resulting probability of CT-SD instability. In an example embodiment, the cause for instability may be due to a large signal at the input which is frequency dependent, loop filter calibration, aggressive noise shaping for the loop filter, and/or other mechanism triggered by the non-linear nature of the data converters.

In addition, the digital engine 108 also detects the signal level to indicate the gain level of the data converter 100 at the second peak detector 114. The digital engine 108 provides the output gain to the gain block 115 and the loop filter coefficient parameters to the loop filter coefficient $\alpha_1$, $\alpha_2$, and $\alpha_3$ 116A-C. The threshold refers to the value set by the user which enables the counter to cross check the input signal with the first threshold for the specific period of time. The first peak detector 110 is operatively connected in series with the second integrator 102C to indicate an instability condition on a signal level at an output of the second integrator 102C exceeding the first threshold.

The calibration circuit 112 is operatively connected in series with the digital engine 108. The calibration circuit 112 typically has a replica of the element used to realize the integrators 102A-C of the loop filter 100 and a fixed clk frequency input. The calibration cycle tunes the component values of the replica circuit to match a constant value based on the constant clk frequency input. The resulting digital code is then copied to all the integrators 102A-C in the main loop filter 100 of the sigma delta. The second peak detector 114 detects an input signal level to the CT-SD data converter circuit 100. The loop filter coefficient $\alpha_1$, $\alpha_2$, and $\alpha_3$ 116A-C are operatively connected in series with each of the integrators 102A-C and are calibrated to maintain stability in the system.

Instability may lead to oscillations by which the outputs of the loop filter integrator would rail (exceed a certain threshold that is acceptable), the peak detector 110 may detect that. If railing happens and continues for a time "Tstab" then the peak detector output may provide a logical signal that indicates that. This logical signal may then trigger the digital section 108 to follow the methodology to bring the sigma delta back to stability. In addition, the loop filter co-efficient $\alpha_1$, $\alpha_2$, and $\alpha_3$ 116A-C are switched to reduce loop filter order/aggressive of the noise transfer function of the system.

Digital bits from section 108 may be used to change the value of components realizing the coeff (for example, if those coeff are realized by resistors, which is our case then the bits are used to control switches in parallel with those resistors. Turning on of those switches may change the coeff values. Changing the loop filter coefficient may change the aggressiveness of the filtering operation of the sigma delta and, hence, affect its stability. Aggressive filter characteristic means better dynamic range, but worse stability and vice-versa. Hence, by tuning those coefficients, one can trade-off dynamic range and stability based on the criteria embodied in the digital section 108.

The DSP unit 118 is operatively connected in series with the modulator 104 and operatively connected in parallel to the digital engine 108. The DSP unit 118 is preferably a decimation filter followed by channel select filter. The calculations are thus performed efficiently and rapidly on digitized output signals received from the first peak detector 110 that are originally analog in nature. The calculations performed and obtained may be with respect to the time/frequency domain and may represent the statistical nature of the input signal peaks as well as the resulting probability of CT-SD loop filter circuit 100 instability. The DSP unit 118 may perform mathematical operations on a data streams to produce second data stream.

The reset switches 120A-B are operatively connected in parallel to the integrators (e.g., the integrator 102C and the integrator 102B, respectively) to reset the integrators 102C, 102B into a first order configuration and reduce system instability. The outputs of integrator 102C, 102B may be held to zero by short circuiting the integrator capacitors (not shown). Therefore, the summer 105 at the input of the quantizer 104 may see only the output signal of integrator 102A, hence the loop filter 100 now comprises one integrator ($1^{st}$ order loop).

Figure 2:
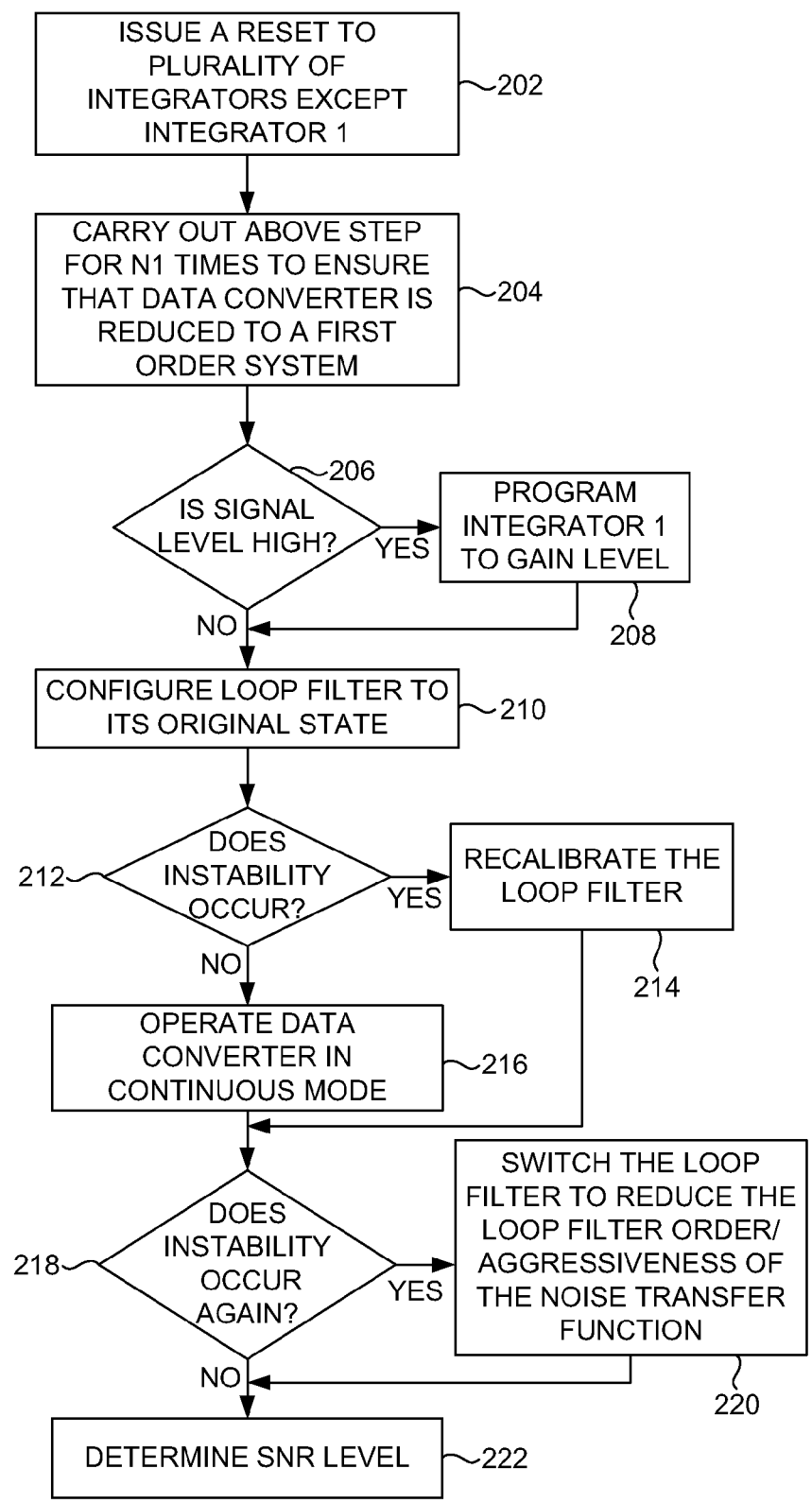
FIG. 2 illustrates a flow diagram illustrating an optimal sequence executed by the digital engine of the data converter of FIG. 1, according to an embodiment herein.

FIG. 2 with reference to FIG. 1 is a flow diagram illustrating an optimal sequence executed by the digital engine 108 of the circuit 100 of FIG. 1, according to an embodiment herein. In step 202, all other integrators (e.g., 102B and 102C) are reset except integrator 102A. In step 204, the previous step 202 is carried out N1 times to ensure that the data converter circuit 100 is reduced to a first order system. N1 may be a predetermined number set by a circuit designer based on a statistical analysis of circuit parameters. In step 206, a signal level is determined. If the signal level is high (Yes), the integrator 1 (e.g., the integrator 102A of FIG. 1) is programmed to a gain level (e.g., by tuning the gain of the amplifiers preceding the data converter circuit 100) or the CT-SD 100 is reduced to a first order configuration until the SNR degrades in step 208, else (No) the loop filter 100 is configured to its original state in step 210.

In one embodiment, the CT-SD 100 can be left in a first order configuration until the SNR level reported by the digital engine 108 degrades. The CT-SD 100 can also be left in a first order configuration only for a set time determined by a variable N2 set by the user/designer. N2 may be a predetermined number set by the circuit designer. The CT-SD 100 can also be left in a first order configuration only for a set time determined by a variable N2 set by the circuit designer. In step 212, the CT-SD 100 is determined for instability occurrence. If instability occurs (Yes), the loop filter circuit 100 is recalibrated in step 214, else (No) the loop filter circuit 100 is operated in a continuous mode in step 216. In step 218, the CT-SD 100 is again determined for instability occurrence. If instability occurs (Yes), the loop filter circuit 100 can be switched to reduce the loop filter aggressive of noise transfer function in step 220, else (No) the SNR level is determined 222 whether to leave the system (e.g., the CT-SD 100) in this state or switch back again and repeat steps 202-222.

Figure 3:
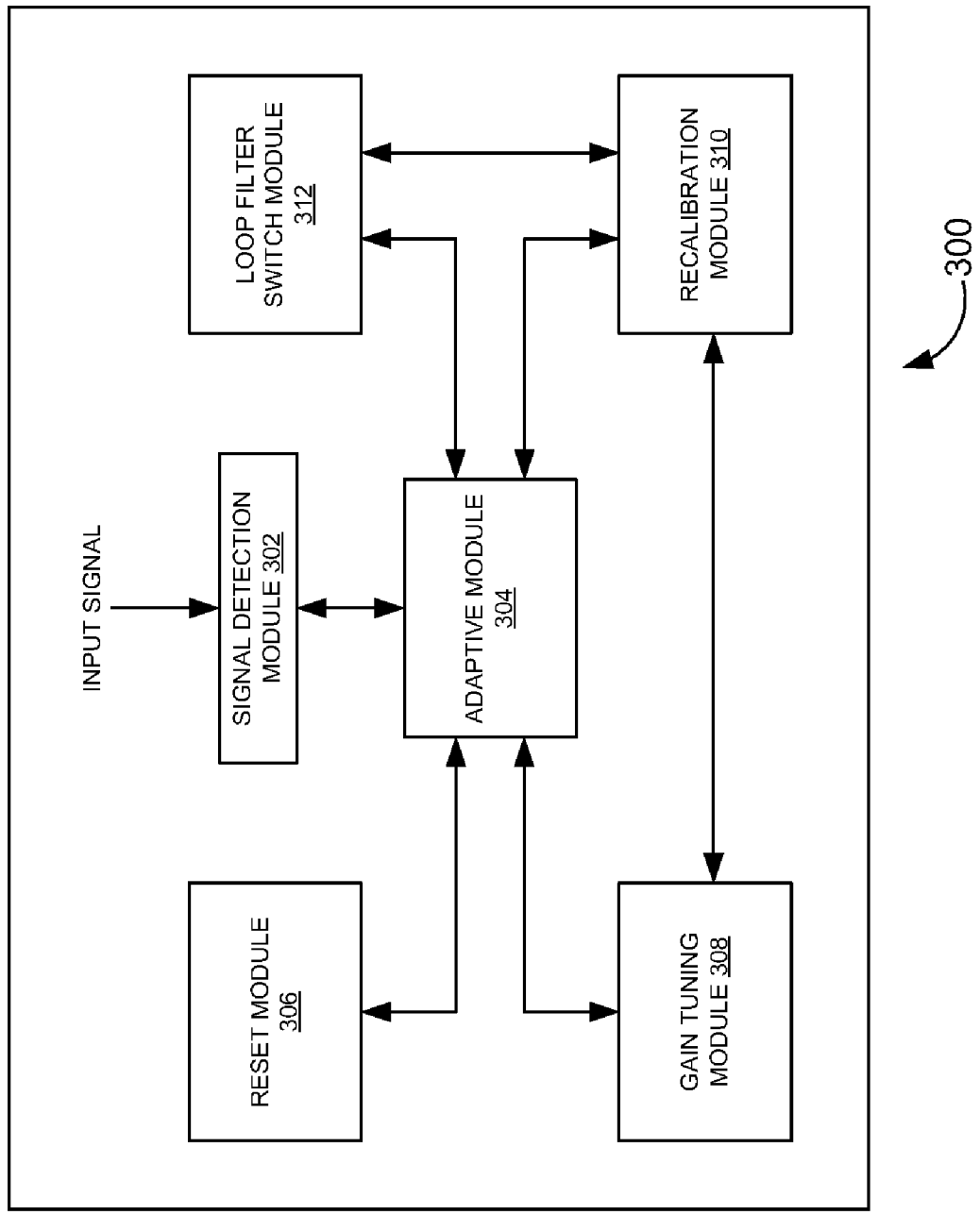
FIG. 3 illustrates a block diagram of an optimization module executed by the digital engine (DE) of FIG. 1 according to an embodiment herein.

FIG. 3 with reference to FIGS. 1 and 2, illustrates a block diagram of an optimization module 300 executed by the digital engine 108 of FIG. 1, the optimization module 300 having a signal detection module 302, an adaptive module 304, a reset module 306, a gain tuning module 308, a recalibration module 310, and a loop filter switch module 312 according to an embodiment herein. The signal detection module 302 enables the peak detector 110 to indicate the signal level (the output signal) of the second integrator 102B. In addition, the signal detection module 304 enables the counter in the digital engine 108 to determine how often the signal level passes the threshold value (set by a user).

The adaptive module 304 may compare the signal level of the output of the peak detector 110 with the first threshold, and compare the signal level of the output of the peak detector 114 with the second threshold, and compute statistical patterns of the signal levels. The reset module 306 enables a reset to the second integrator 102B and the third integrator 102C for reducing the CT-SD loop filter circuit 100 to a first order system. The outputs of integrator 102C, 102B may be held to zero by short-circuiting the integrator capacitors. Hence, the summer 105 at the input of the quantizer 104 may see only the output signal of integrator 102A, hence the loop filter now comprises one integrator ($1^{st}$ order loop).

The gain tuning module 308 enables the tuning of the gain level of amplifier (e.g., the first integrator 102A of FIG. 1) when the signal level of the second integrator 102B is higher than the first threshold in the peak detector 110. The gain of the sigma delta may be adjusted by changing the coefficient 114. This may be simply a resistor whose value is adjusted by a digital switch or may be a transconductance whose transconductance is changed based on the digital signal received from 108. The recalibration module 310 enables a recalibration to the CT-SD loop filter circuit 100 when instability occurs.

The calibration circuit 112 may tune the filter parameter to a constant reference, for example a constant clock frequency. The output of this circuit 112 may be a digital code that is used to change the frequency characterisics of the loop filter integrators 102A-102C (by switching in and out the integrator capacitor or resistor elements). In an example embodiment, the recalibration module 310 has a calibration replica circuit (not shown) which is turned on. The calibration replica circuit may be a part of the calibration circuit 112 and this circuit may be tuned and compared to a constant level. The instability of the system is indicated by the counter of the digital engine 108. The loop filter switch module 312 enables switching the loop filter coefficient $\alpha_1$, $\alpha_2$, and $\alpha_3$ 116A-C to reduce the loop filter circuit 100 to the first order configuration if instability occurs even after recalibrating the CT-SD loop filter circuit 100.

Figure 4:
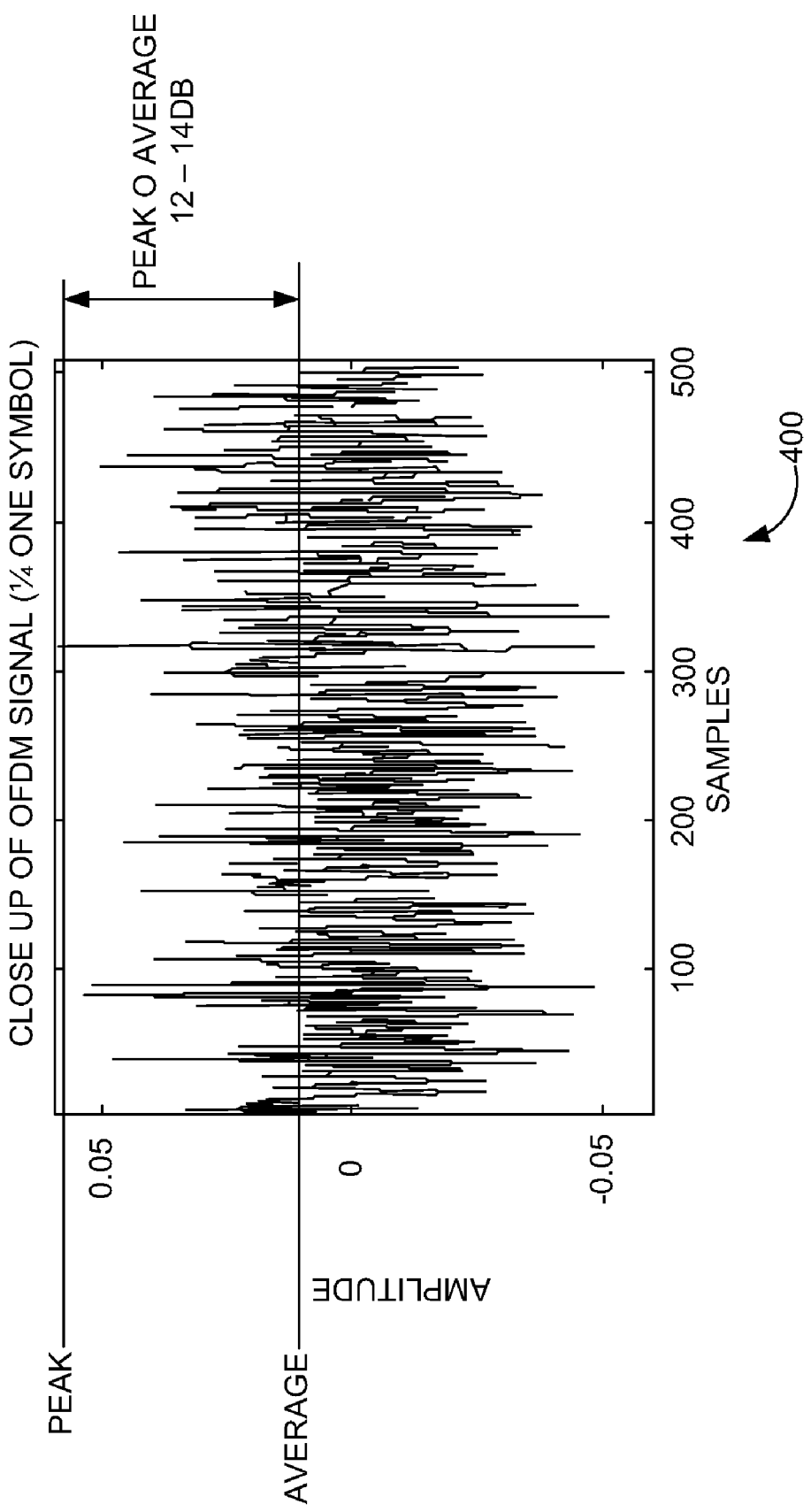
FIG. 4 illustrates a graph representation showing the statistical nature of an OFDM signal transient indicating a large peak to average content according to an embodiment herein.

FIG. 4 illustrates a graph representation 400 showing statistical nature of OFDM signal transient indicating large peak to average content. The graph 400 is a plot of samples in the X-axis and amplitude in the Y-axis for an OFDM signal (¼ one symbol). The graph 400 illustrates varying amplitude level of the signals which varies from a minimum value 0 to a maximum positive value 0.05 and negative value 0.05 for varying samples from 0 to a value of 500.

The signal level at the output of the CT-SD loop filter 100 may be indicated by the peak detector 110. The input signal level to the CT-SD loop filter 100 may be detected by an optional peak detector (not shown). The outputs may be stored in a counter for processing by a digital section. In a preferred embodiment, the counters indicate how often the input signal passes a certain limit and how many times the CT-SD was unstable. Over time, this data represents the statistical nature of the input signal peaks as well as the resulting probability of CT-SD instability. The value of signal level peak to average lies between approximately 12-14 dB.

Figure 5:
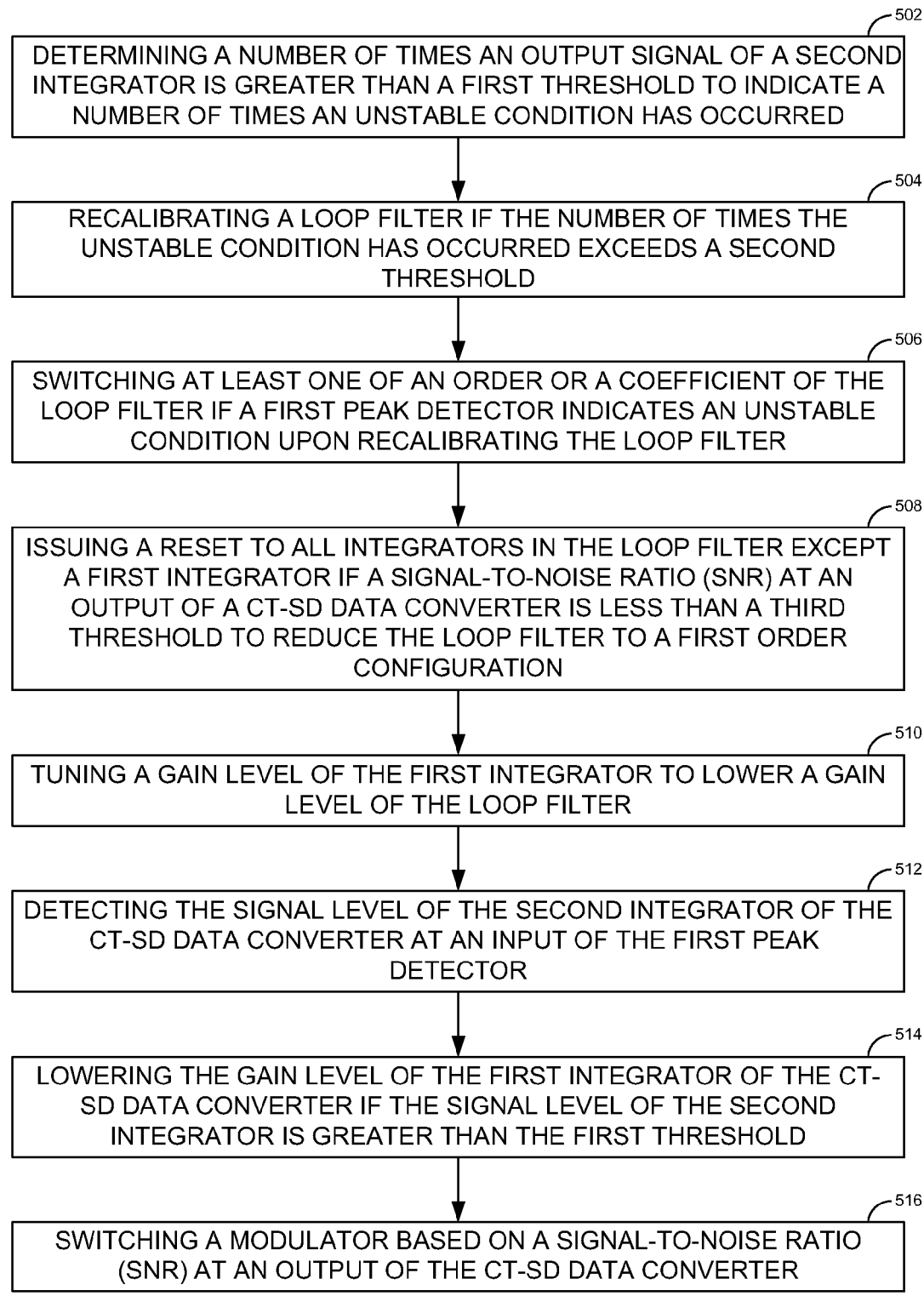
FIG. 5 illustrates a process flow for a method of reconfiguring a CT-SD data converter according to an embodiment herein.

FIG. 5, with reference to FIGS. 1 through 4, illustrates a process flow 500 for a method of reconfiguring a continuous time-sigma delta (CT-SD) data converter. In step 502, the number of times an output signal of a second integrator is greater than a first threshold is determined to indicate a number of times an unstable condition has occurred. In step 504, a loop filter is recalibrated if the number of times an unstable condition occurred exceeds the second threshold (e.g., the recalibration module 310 enables a recalibration to the CT-SD loop filter circuit 100 when instability occurs, the output of this circuit may be a digital code that is used to change the frequency characteristics of loop filter integrators 102A-C (by switching in and out the integrator capacitor or resistor elements). In an example embodiment, the recalibration module 310 has a calibration replica circuit (not shown) which is turned on. The calibration replica circuit may be a part of the calibration circuit 112 and this circuit may be tuned and compared to a constant level.

In step 506, an order or a coefficient of the loop filter is switched (e.g., the loop filter switch module 312 enables switching the loop filter coefficient $\alpha_1$, $\alpha_2$, and $\alpha_3$ 116A-C to reduce the loop filter circuit 100 to the first order configuration if instability occurs even after recalibrating the CT-SD loop filter circuit 100, if the first peak detector 110 indicates an unstable condition upon recalibrating the loop filter. In step 508, a reset may be issued to all integrators 102B-C in the loop filter 100 except first integrator 102A, if a SNR at an output of CT-SD data converter 100 is less than a third threshold to reduce the loop filter 100 to a first order configuration (e.g., the reset module 306 may enable a reset to the second integrator 102B and the third integrator 102C for reducing the CT-SD loop filter circuit 100 to a first order system).

The outputs of integrators 102C, 102B may be held to zero by short circuiting the integrator capacitors. Hence the summer 105 at the input of the quantizer 104 may see only the output signal of integrator 102A, hence the loop filter 100 now comprises one integrator ($1^{st}$ order loop)). In step 510, a gain level of the first integrator 102A may be tuned to lower a gain level of the loop filter (e.g., the gain tuning module 308 may enable the tuning of the gain level of amplifier. The gain of the sigma delta may be adjusted by changing the coefficient 114. This may be a resistor whose value is adjusted by a digital switch or may be a transconductance whose transconductance is changed based on the digital signal received from 108).

In step 512, a signal level of a second integrator 102B of the CT-SD data converter 100 may be detected at an input of the first peak detector 110 (e.g., the signal detection module 302 may enable the peak detector 110 to indicate the signal level (the output signal) of the second integrator 102B. In addition, the signal detection module 304 may enable the counter in the digital engine 108 to determine how often the signal level 303 passes the threshold value (set by a user). In step 514, the gain level of the first integrator 102A of the CT-SD data converter 100 is lowered, if the signal level of the second integrator 102B is greater than the first threshold. In step 516, a modulator 104 may be switched based on a SNR at an output of the CT-SD data converter 100.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments herein can take the form of an entirely hardware embodiment, an entirely software embodiment or an embodiment including both hardware and software elements. The embodiments that are implemented in software include but are not limited to, firmware, resident software, microcode, etc.

Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 6:
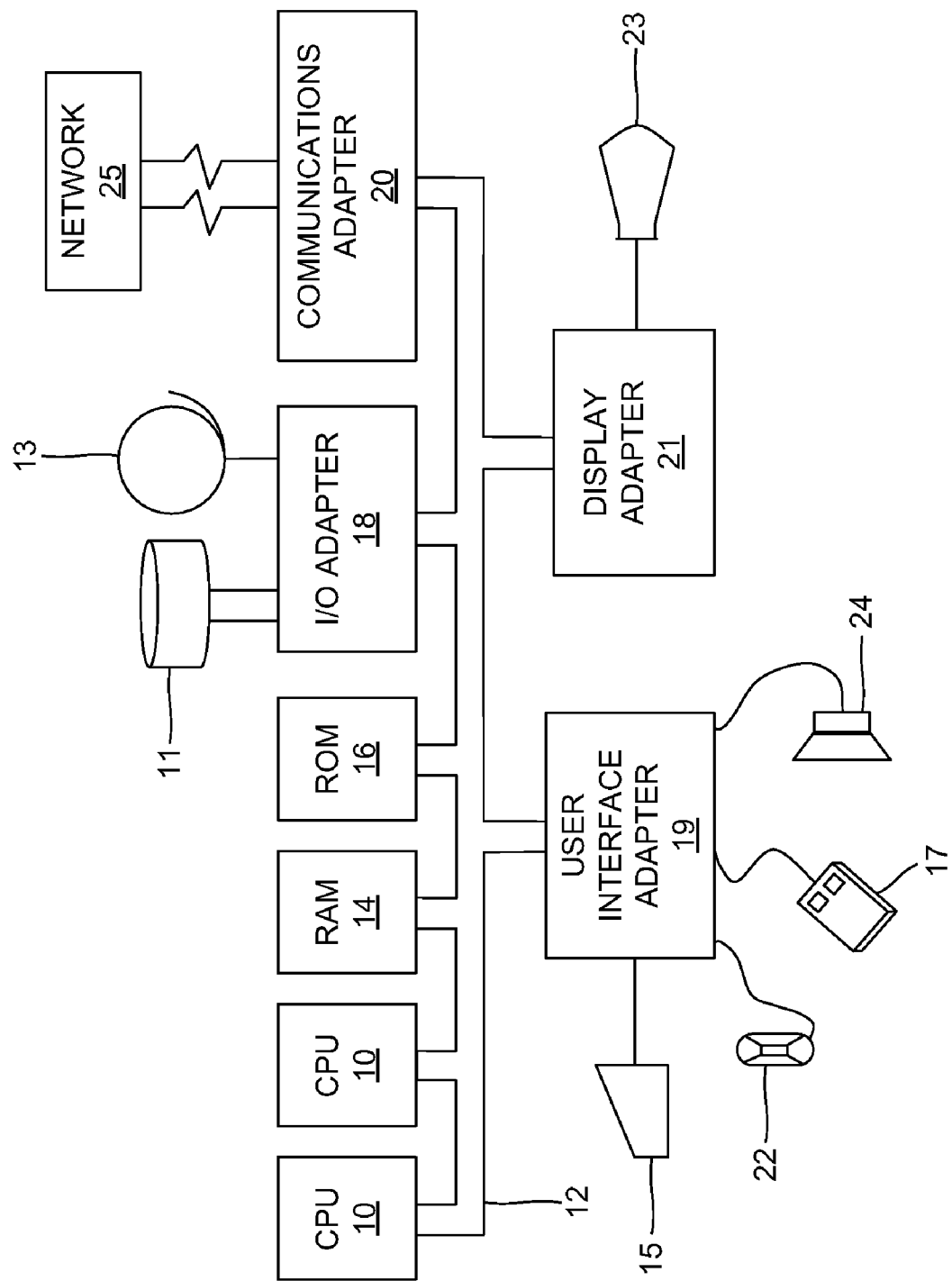
FIG. 6 illustrates a schematic diagram of a computer architecture used in accordance with the embodiments herein.

A representative hardware environment for practicing the embodiments herein is depicted in FIG. 6. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The CS-TD loop filter circuit 100 may be re-configured to optimize stability and dynamic range based on a programmable algorithm. This approach of optimizing stability and dynamic range may be implemented in software or digital hardware (computer simulators) to statistically observe the instability patterns and the input signal level. In addition, the CT-SD 100 may be recalibrated and the loop filter integrators (e.g., the second integrator 102B and the third integrator 102C of FIG. 1) can be reset (using the reset module 202) to improve the dynamic range significantly for signals with large and average peak values (e.g., OFDM access used in wireless applications). Furthermore, the embodiments herein also solve the problem of temperature variations which can cause the loop filter response of the CT-SD 100 to change and hence degrade stability and performance.

The CT-SD loop filter circuit 100 enables an operator to program the algorithm for slightly reducing the dynamic range (e.g., by relaxing the loop filter), thus improving the probability of unstable operations and providing an update of the loop filter characteristics based on the stability. The CT-SD loop filter circuit 100 may be used in systems such as television (TV) tuners, mobile phones, and satellite tuners) as well as in audio applications, hearing aids, modems, and wire line applications.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A continuous time-sigma delta (CT-SD) data converter comprising:
    a loop filter comprising a first integrator having a first loop filter coefficient and a second integrator operatively coupled to said first integrator, said second integrator having a second loop filter coefficient;
    a modulator coupled to said loop filter;
    a reset switch coupled to said second integrator;
    a first peak detector operatively coupled in series with said second integrator to indicate an instability condition of a signal level exceeding a first threshold at an output of said second integrator;
    a second peak detector adapted to detect an input signal level to said CT-SD data converter; and
    a digital engine coupled to said first peak detector, said digital engine configured to execute an optimal processing sequence based on at least one of:
        a pattern of differences between said signal level indicated by said first peak detector and said first threshold; and
        said input signal level detected by said second peak detector.

2. The CT-SD data converter of claim 1, wherein said reset switch is adapted to issue a reset to said second integrator to reduce said CT-SD data converter to a first order system.

3. The CT-SD data converter of claim 1, wherein said digital engine is configured to relax said loop filter to reduce a dynamic range of said modulator.

4. The CT-SD data converter of claim 1, further comprising a calibration circuit adapted to calibrate a loop filter frequency response.

5. The CT-SD data converter of claim 1, wherein said digital engine comprises at least one counter, said counter adapted to indicate at least one of (i) a number of times an unstable condition has occurred, and (ii) a number of times said signal level exceeds said first threshold.

6. The CT-SD data converter of claim 1, further comprising a digital signal processor unit adapted to perform calculations on a digitized output signal received from said modulator.

7. A program storage device readable by computer, tangibly embodying a program of instructions executable by said computer to perform a method of reconfiguring a continuous time-sigma delta (CT-SD) data converter, said CT-SD data converter comprising:
    a loop filter comprising a first integrator having a first loop filter coefficient and a second integrator operatively coupled to said first integrator, said second integrator having a second loop filter coefficient;
    a modulator coupled to said loop filter;
    a reset switch coupled to said second integrator;
    a first peak detector operatively coupled in series with said second integrator to indicate an instability condition of a signal level exceeding a first threshold at an output of said second integrator; and
    a second peak detector adapted to detect an input signal level to said CT-SD data converter;
    wherein said method comprises:
        determining a number of times said output signal of said second integrator is greater than said first threshold to indicate a number of times an unstable condition has occurred, wherein said first threshold is based on a statistical pattern of said output signal of said second integrator;
        recalibrating said loop filter if said number of times said unstable condition has occurred exceeds a second threshold; and
        switching at least one of an order and a coefficient of said loop filter if said first peak detector indicates an unstable condition upon recalibrating said loop filter.

8. The program storage device of claim 7, wherein said method further comprises:
    issuing a reset to all integrators in said loop filter except said first integrator if a signal-to-noise ratio (SNR) at an output of said CT-SD data converter is less than a third threshold to reduce said loop filter to a first order configuration; and
    tuning a gain level of said first integrator to lower a gain level of said loop filter.

9. The program storage device of claim 7, wherein said method further comprises detecting said signal level of said second integrator of said CT-SD data converter at an input of said first peak detector.

10. The program storage device of claim 7, wherein said method further comprises lowering said gain level of said first integrator of said CT-SD data converter if said signal level of said second integrator is greater than said first threshold.

11. The program storage device of claim 10, wherein said lowering said gain level is achieved by at least one of (i) programming said first integrator to said gain level, and (ii) tuning the gain of amplifiers preceding said CT-SD data converter.

12. The program storage device of claim 7, wherein said method further comprises switching said modulator based on a signal-to-noise ratio (SNR) at an output of said CT-SD data converter.

13. A method of reconfiguring a Continuous Time-Sigma delta (CT-SD) data converter, the continuous time-sigma delta (CT-SD) data converter comprising:
    a loop filter comprising a first integrator having a first loop filter coefficient and a second integrator operatively coupled to said first integrator, said second integrator having a second loop filter coefficient;
    a modulator coupled to said loop filter;
    a reset switch coupled to said second integrator;
    a first peak detector operatively coupled in series with said second integrator to indicate an instability condition of a signal level exceeding a first threshold at an output of said second integrator; and
    a second peak detector adapted to detect an input signal level to said CT-SD data converter;
    wherein said method comprises:
        determining a number of times said output signal of said second integrator is greater than said first threshold to indicate a number of times an unstable condition has occurred, wherein said first threshold is based on a statistical pattern of said output signal of said second integrator;

recalibrating said loop filter if said number of times said unstable condition has occurred exceeds a second threshold; and switching at least one of an order or a coefficient of said loop filter if said first peak detector indicates an unstable condition upon recalibrating said loop filter.

14. The method of claim 13, wherein said method further comprises:

issuing a reset to all integrators in said loop filter except said first integrator if a signal-to-noise ratio (SNR) at an output of said CT-SD data converter is less than a third threshold to reduce said loop filter to a first order configuration; and tuning a gain level of said first integrator to lower a gain level of said loop filter.

15. The method of claim 13, wherein said method further comprises detecting said signal level of said second integrator of said CT-SD data converter at an input of said first peak detector.

16. The method of claim 13, wherein said method further comprises lowering said gain level of said first integrator of said CT-SD data converter if said signal level of said second integrator is greater than said first threshold.

17. The method of claim 13, wherein said method further comprises switching said modulator based on a signal-to-noise ratio (SNR) at an output of said CT-SD data converter.

18. The method of claim 16, wherein said lowering said gain level is achieved by at least one of (i) programming said first integrator to said gain level, and (ii) tuning the gain of amplifiers preceding said CT-SD data converter.

* * * * *